United States Patent
Schillak

(10) Patent No.: US 10,649,052 B1
(45) Date of Patent: May 12, 2020

(54) METHOD AND DEVICE FOR SIMULTANEOUS TX/RX IN STRONGLY COUPLED MRI COIL LOOPS

(71) Applicant: Life Services, LLC, Minneapolis, MN (US)

(72) Inventor: Scott M. Schillak, Minneapolis, MN (US)

(73) Assignee: Life Services, LLC, Minneapolis, MN (US)

( * ) Notice: Subject to any disclaimer, the term of this patent is extended or adjusted under 35 U.S.C. 154(b) by 0 days.

(21) Appl. No.: 16/410,436

(22) Filed: May 13, 2019

Related U.S. Application Data

(63) Continuation of application No. 15/143,498, filed on Apr. 29, 2016, now Pat. No. 10,288,711.

(60) Provisional application No. 62/155,461, filed on Apr. 30, 2015.

(51) Int. Cl.
| | |
|---|---|
| *G01R 33/56* | (2006.01) |
| *G01R 33/36* | (2006.01) |
| *G01R 33/34* | (2006.01) |
| *G01R 33/46* | (2006.01) |

(52) U.S. Cl.
CPC ............ *G01R 33/56* (2013.01); *G01R 33/34* (2013.01); *G01R 33/3621* (2013.01); *G01R 33/3628* (2013.01); *G01R 33/4625* (2013.01)

(58) Field of Classification Search
CPC .... G01R 33/56; G01R 33/34; G01R 33/3621; G01R 33/3628; G01R 33/4625
See application file for complete search history.

(56) References Cited

U.S. PATENT DOCUMENTS

| | | | |
|---|---|---|---|
| 4,682,125 A | 7/1987 | Harrison et al. |
| 4,763,076 A | 8/1988 | Arakawa et al. |
| 4,801,553 A | 1/1989 | Owen et al. |
| 4,885,539 A | 12/1989 | Roemer et al. |
| 4,894,589 A | 1/1990 | Borowiec |
| 4,947,119 A | 8/1990 | Ugurbil et al. |

(Continued)

FOREIGN PATENT DOCUMENTS

WO  WO_2000037918  6/2000

OTHER PUBLICATIONS

Augustine, George J., "Combining patch-clamp and optical methods in brain slices", "Journal of Neuroscience Methods", Oct. 1994, pp. 163-169, vol. 54, Publisher: Elsevier.

(Continued)

*Primary Examiner* — Tung X Nguyen
*Assistant Examiner* — Feba Pothen
(74) *Attorney, Agent, or Firm* — Charles A. Lemaire; Jonathan M. Rixen; Lemaire Patent Law Firm, P.L.L.C.

(57) ABSTRACT

A method and apparatus for processing radio-frequency (RF) signals suitable for magnetic-resonance imaging (MRI) and/or magnetic-resonance spectroscopy (MRS) from radio-frequency (RF) coils that have strongly-coupled coil loop pairs, each pair including a transmit loop and a receive loop, wherein the transmit loop and the receive loop are of equal sizes and shapes and in close proximity to each other, and wherein a suitable attenuated and phase-adjusted version of a transmit pulse is subtracted from a receive signal obtained from tissue being examined to improve signal-to-noise ratio (SNR) of the received signal.

20 Claims, 4 Drawing Sheets

(56) References Cited

U.S. PATENT DOCUMENTS

| | | | |
|---|---|---|---|
| 5,045,777 A * | 9/1991 | Itagaki | G01R 33/56 |
| | | | 324/307 |
| 5,075,600 A | 12/1991 | El-Hamasy et al. | |
| 5,304,930 A | 4/1994 | Crowley et al. | |
| 5,451,876 A * | 9/1995 | Sandford | A61B 5/055 |
| | | | 324/314 |
| 5,480,482 A | 1/1996 | Novinson | |
| 5,557,247 A | 9/1996 | Vaughan, Jr. | |
| 5,665,398 A | 9/1997 | McCormick | |
| 5,714,831 A | 2/1998 | Walker et al. | |
| 5,744,957 A | 4/1998 | Vaughan, Jr. | |
| 5,836,877 A | 11/1998 | Zavislan | |
| 5,886,596 A | 3/1999 | Vaughan, Jr. | |
| 5,908,386 A | 6/1999 | Ugurbil et al. | |
| 5,990,681 A | 11/1999 | Richard et al. | |
| 6,002,251 A | 12/1999 | Sun | |
| 6,100,694 A | 8/2000 | Wong | |
| 6,150,816 A | 11/2000 | Srinivasan | |
| 6,300,761 B1 | 10/2001 | Hagen et al. | |
| 6,396,271 B1 | 5/2002 | Burl et al. | |
| 6,495,069 B1 | 12/2002 | Lussey et al. | |
| 6,534,983 B1 | 3/2003 | Boskamp et al. | |
| 6,538,441 B1 | 3/2003 | Watkins et al. | |
| 6,593,744 B2 | 7/2003 | Burl et al. | |
| 6,605,775 B1 | 8/2003 | Seeber et al. | |
| 6,633,161 B1 | 10/2003 | Vaughan, Jr. | |
| 6,636,037 B1 | 10/2003 | Ou-Yang | |
| 6,636,414 B2 | 10/2003 | Obert et al. | |
| 6,650,116 B2 | 11/2003 | Garwood et al. | |
| 6,664,465 B2 | 12/2003 | Seeber et al. | |
| 6,788,056 B2 | 9/2004 | Vaughan, Jr. et al. | |
| 6,788,057 B1 | 9/2004 | Petropoulos et al. | |
| 6,788,058 B1 | 9/2004 | Petropoulos et al. | |
| 6,822,448 B2 | 11/2004 | Watkins et al. | |
| 6,822,450 B2 | 11/2004 | Klinge et al. | |
| 6,834,238 B1 | 12/2004 | Hochman | |
| 6,888,348 B2 | 5/2005 | Kupce | |
| 6,930,480 B1 | 8/2005 | Fijita et al. | |
| 6,946,840 B1 | 9/2005 | Zou et al. | |
| 6,958,607 B2 | 10/2005 | Vaughan, Jr. et al. | |
| 6,969,992 B2 | 11/2005 | Vaughan, Jr. et al. | |
| 6,975,115 B1 | 12/2005 | Fujita et al. | |
| 6,977,502 B1 | 12/2005 | Hertz | |
| 6,980,002 B1 | 12/2005 | Petropoulos et al. | |
| 7,023,209 B2 | 4/2006 | Zhang et al. | |
| 7,042,222 B2 | 5/2006 | Zheng et al. | |
| 7,071,693 B2 | 7/2006 | Yasuhara | |
| 7,084,631 B2 | 8/2006 | Qu et al. | |
| 7,088,104 B2 | 8/2006 | Bottomley | |
| 7,119,541 B2 | 10/2006 | Barberi | |
| 7,123,012 B2 | 10/2006 | Srinivasan | |
| 7,268,554 B2 | 9/2007 | Vaughan, Jr. | |
| 7,279,899 B2 | 10/2007 | Michaeli et al. | |
| 7,292,038 B2 | 11/2007 | Doty | |
| 7,295,870 B2 | 11/2007 | Allain et al. | |
| 7,403,006 B2 | 7/2008 | Garwood et al. | |
| 7,436,103 B2 | 10/2008 | Kawakubo et al. | |
| 7,439,736 B2 | 10/2008 | Meaney et al. | |
| 7,474,098 B2 | 1/2009 | King | |
| 7,514,926 B2 | 4/2009 | Adriany et al. | |
| 7,598,739 B2 | 10/2009 | Vaughan, Jr. et al. | |
| 7,633,293 B2 | 12/2009 | Olson et al. | |
| 7,672,650 B2 | 3/2010 | Sorrells et al. | |
| 7,710,117 B2 | 5/2010 | Vaughan et al. | |
| 7,777,484 B2 | 8/2010 | Garwood et al. | |
| 7,800,368 B2 | 9/2010 | Vaughan et al. | |
| 8,035,384 B2 | 10/2011 | Saha | |
| 8,093,900 B2 | 1/2012 | Bennett | |
| 8,093,978 B2 | 1/2012 | Kawarai et al. | |
| 8,193,809 B2 | 6/2012 | Akgun et al. | |
| 8,217,653 B2 | 7/2012 | Vaughan et al. | |
| 8,222,796 B2 | 7/2012 | Bhaskaran et al. | |
| 8,299,681 B2 | 10/2012 | Snyder et al. | |
| 8,380,266 B2 | 2/2013 | Vaughan, Jr. et al. | |
| 8,604,791 B2 | 12/2013 | Vaughan et al. | |
| 8,674,695 B2 | 3/2014 | Wiggins | |
| 8,788,044 B2 | 7/2014 | John | |
| 9,097,769 B2 | 8/2015 | Schillak et al. | |
| 9,320,452 B2 | 4/2016 | Garwood et al. | |
| 9,568,572 B2 | 2/2017 | Vaughan, Jr. | |
| 10,191,128 B2 | 1/2019 | Feinberg et al. | |
| 10,254,360 B2 | 4/2019 | Morich et al. | |
| 2003/0091980 A1 | 5/2003 | Lynch et al. | |
| 2003/0206019 A1 | 11/2003 | Boskamp | |
| 2005/0264291 A1 | 12/2005 | Vaughan et al. | |
| 2006/0001426 A1 | 1/2006 | Vaughan et al. | |
| 2007/0236490 A1 | 10/2007 | Casteele et al. | |
| 2008/0180101 A1 | 7/2008 | Bradshaw et al. | |
| 2009/0134965 A1 | 5/2009 | Lemdiasov et al. | |
| 2009/0264733 A1 | 10/2009 | Corum et al. | |
| 2012/0223709 A1 * | 9/2012 | Schillak | G01R 33/3607 |
| | | | 324/309 |
| 2014/0300355 A1 * | 10/2014 | Fautz | G01R 33/28 |
| | | | 324/309 |
| 2016/0069968 A1 * | 3/2016 | Rothberg | G01R 33/3854 |
| | | | 324/322 |

OTHER PUBLICATIONS

Cho, Y.K., et al., "Noninvasive measurements of transmural myocardial metabolites using 3-D (31)P NMR spectroscopy.", "Am J Physiology", Jan. 2001, pp. H489-H497, vol. 280, No. 1.

Nelder, J.A., et al., "A simplex method for function minimization", "Comput J.", 1965, pp. 308-313, vol. 7, No. 4.

Roemer, et al., "The NMR Phased Array", "Magnetic Resonance in Medicine", Nov. 1990, pp. 192-225, vol. 16, No. 2.

Sung K., et al., "B1+ Compensation in 3T Cardiac Imaging Using Short 2DRF Pulses", "Magnetic Resonance in Medicine", Mar. 2008, pp. 441-446, vol. 59, No. 3.

Vaughan, J.T., et al., "Clinical Imaging at 7T with a 16 Channel Whole Body Coil and 32 Receive Channels.", "Proceedings 17th Scientific Meeting, International Society for Magnetic Resonance in Medicine", Apr. 2009, pp. 392.

Wiggins, et al., "96-Channel Receive-Only Head Coil for 3 Tesla: Design Optimization and Evaluation", "Magn. Reson. Med.", Sep. 2009, pp. 754-762, vol. 62, No. 3.

* cited by examiner

*FIG. 1A (Front view)*
*FIG. 1B (Side view)*
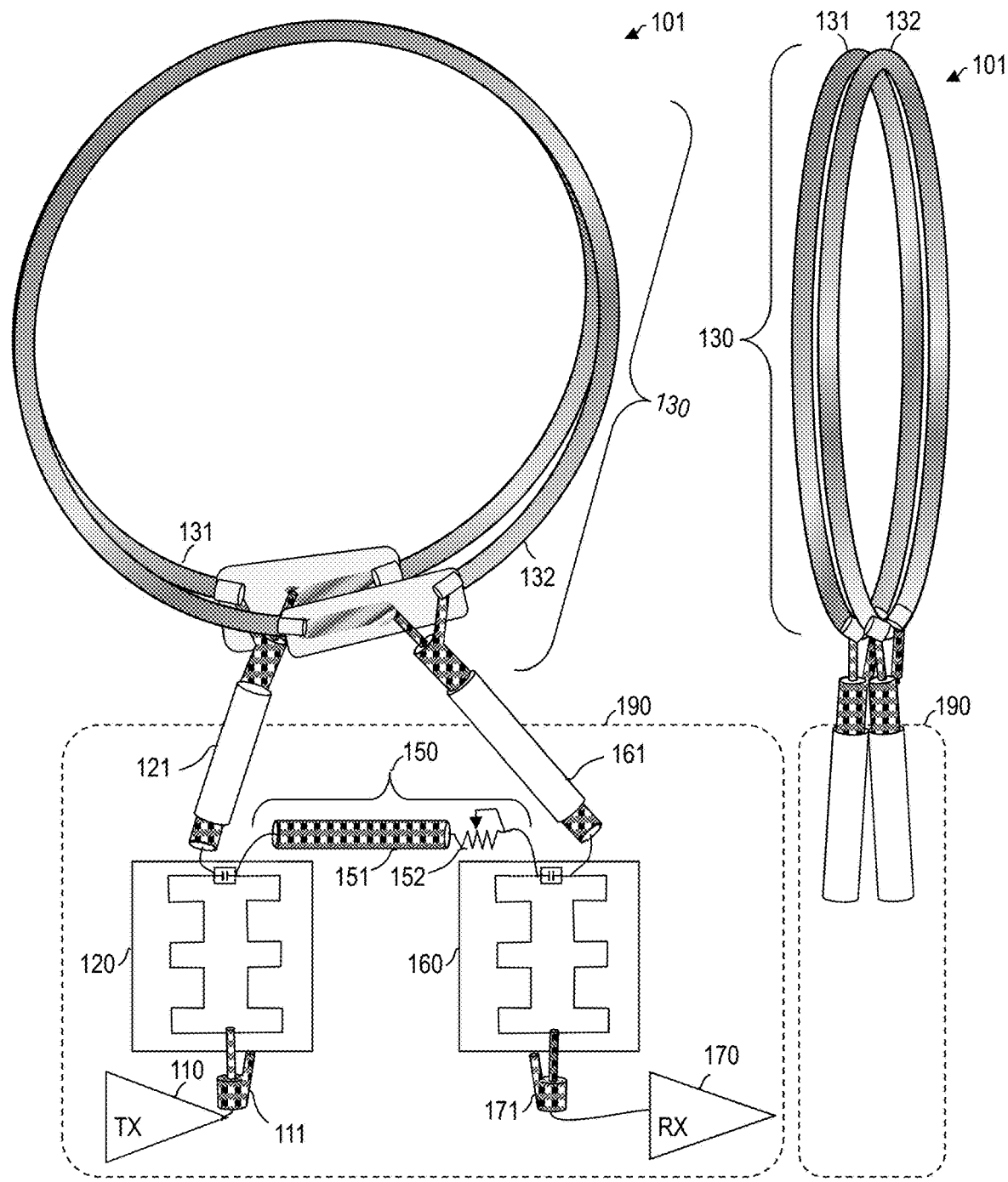
*FIG. 1C (Block diagram)*

(Block diagram)

*(Block diagram)*

METHOD AND DEVICE FOR SIMULTANEOUS TX/RX IN STRONGLY COUPLED MRI COIL LOOPS

CROSS-REFERENCE TO RELATED APPLICATIONS

This application is a continuation of U.S. patent application Ser. No. 15/143,498, filed Apr. 29, 2016 by Scott M. Schillak and titled "DEVICE AND METHOD AND FOR SIMULTANEOUS TX/RX IN STRONGLY COUPLED MRI COIL LOOPS" (which issued as U.S. Pat. No. 10,288,711 on May 14, 2019), which claims priority benefit under 35 U.S.C. § 119(e) of U.S. Provisional Patent Application No. 62/155,461 filed Apr. 30, 2016 by Scott M. Schillak, titled "DEVICE AND METHOD FOR SIMULTANEOUS TX/RX IN STRONGLY COUPLED MRI COIL LOOPS," each of which is incorporated herein by reference in its entirety.

This invention is related to:
U.S. patent application Ser. No. 14/619,051 filed Feb. 10, 2015 by Scott M. Schillak et al., titled "DEVICE AND METHOD FOR LOOPS-OVER-LOOPS MRI COILS" (which issued as U.S. Pat. No. 10,191,128 on Jan. 29, 2019),
U.S. Provisional Patent Application 61/939,255 filed Feb. 12, 2014 by Scott M. Schillak et al., titled "DEVICE AND METHOD FOR LOOPS-OVER-LOOPS MRI COILS,"
U.S. Pat. No. 9,097,769 issued Aug. 4, 2015 to Scott M. Schillak et al., titled "SIMULTANEOUS TX-RX FOR MRI SYSTEMS AND OTHER ANTENNA DEVICES," and
U.S. Provisional Patent Application No. 61/447,673 filed Feb. 28, 2011 by Scott M. Schillak et al., titled "SIMULTANEOUS TX-RX FOR MRI SYSTEMS AND OTHER ANTENNA DEVICES,"
which are all incorporated herein by reference in their entirety.

FIELD OF THE INVENTION

This invention relates to the field of magnetic-resonance imaging (MRI) and magnetic-resonance spectroscopy (MRS), and more specifically to a method and apparatus for using pairs of strongly coupled overlapped and/or concentric radio-frequency (RF) MRI coils, with a signal combiner-subtractor configured to subtract a suitably adjusted copy of the transmit pulse from the received signal in order to extract signal from the closely-coupled coil loops and to improve signal-to-noise ratio (SNR) of the received signal.

BACKGROUND OF THE INVENTION

U.S. Pat. No. 6,605,775 to Seeber et al. issued Aug. 12, 2003 with the title "Floating radio frequency trap for shield currents" and is incorporated herein by reference. In U.S. Pat. No. 6,605,775, Seeber et al. describe a floating shield current trap that provides first and second concentric tubular conductors electrically connected to provide a resonance-induced high impedance of current flow in a path consisting of the inner and outer conductors and their junctions thereby suppressing coupled current flow on a shield of a conductor contained within the first inner tubular conductor.

U.S. Pat. No. 6,664,465 to Seeber issued Dec. 16, 2003 with the title "Tuning system for floating radio frequency trap" and is incorporated herein by reference. In U.S. Pat. No. 6,664,465, Seeber describes a floating shield current trap provides two resonance loops formed of split concentric tubular conductors joined radially at their axial ends. Adjustment of the separation of these loops provides a change in coupling between the loops effecting a simplified tuning of the resonance of the trap for different expected frequencies of interfering shield current.

U.S. Pat. No. 6,593,744 to Burl et al. issued Jul. 15, 2003 with the title "Multi-channel RF cable trap for magnetic resonance apparatus" and is incorporated herein by reference. In U.S. Pat. No. 6,593,744, Burl et al. describe a multi-channel RF cable trap that blocks stray RF current from flowing on shield conductors of coaxial RF cables of a magnetic resonance apparatus. An inductor is formed by a curved semi-rigid trough constructed of an insulating material coated with an electrically conducting layer. Preferably, the inductor and the cable follow an "S"-shaped path to facilitate good electromagnetic coupling. The RF cables are laid in the trough and the shield conductors inductively couple with the inductor. A capacitor and optional trim capacitor are connected across the trough of the inductor to form a resonant LC circuit tuned to the resonance frequency. The LC circuit inductively couples with the shield conductors to present a signal-attenuating high impedance at the resonance frequency. The resonant circuit is preferably contained in an RF-shielding box with removable lid.

Low-power circuits can use varactors (electrically variable capacitors), field-effect transistors (used as variable gain elements or variable resistors) and like components that are directly electrically-adjustable, for use in adjusting frequency, impedance or other circuit characteristics and parameters, however such components are often unsuitable or inoperative in high fields.

U.S. Pat. No. 6,495,069 issued Dec. 17, 2002 to Lussey et al. with the title "Polymer composition" and is incorporated herein by reference. In U.S. Pat. No. 6,495,069, Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 8,299,681 to Snyder, Vaughan and Lemaire issued Oct. 30, 2012 with the title "Remotely adjustable reactive and resistive electrical elements and method" and is incorporated herein by reference. In U.S. Pat. No. 8,299,681, Snyder et al. describe an apparatus and method that includes providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

U.S. Pat. No. 8,674,695 issued Mar. 18, 2014 to Wiggins with the title "Radio Frequency Coil Arrangement for High Field Magnetic Resonance Imaging with Optimized Transmit and Receive Efficiency for a Specified Region of Interest, and Related System and Method," and is incorporated herein by reference. In U.S. Pat. No. 8,674,695, Wiggins describes exemplary embodiments of a coil arrangement that can include, e.g., a plurality of elements which can be provided at an angle from one another. The angle can be selected to effectuate an imaging of a target region of interest at least one of a predetermined depth or range of depths, for example. In certain exemplary embodiments, the angle can be selected to effectuate an exemplary predetermined transmit efficiency for at least one of the elements. Additionally, the exemplary angle can be selected to effectuate a predetermined receive sensitivity for at least one of the elements. Further, according to certain exemplary embodiments of a coil arrangement in according to the present disclosure, the angle can be adjusted manually and/or automatically.

A journal article, "96-Channel Receive-Only Head Coil for 3 Tesla: Design Optimization and Evaluation" by Graham C. Wiggins et al. (Magn. Reson. Med. 2009 September; 62(3): 754-762. doi:10.1002/mrm.22028) describes a receive coil, and is incorporated herein by reference.

U.S. Pat. No. 4,885,539 to Roemer et al. issued Dec. 5, 1989 with the title "Volume NMR coil for optimum signal-to-noise ratio" and is incorporated herein by reference. In U.S. Pat. No. 4,885,539, Roemer et al. describe an RF volume coil with optimized signal-to-noise ratio, for NMR use, has a reduced length $L_c$, which is between about $0.3 r_s$ and about $1.5 r_s$, where $r_s$ is the radius of a sample-to-be-investigated, contained within the cylindrical volume coil, with the volume coil radius $r_c$ being between about $1.0 r_s$ and about $1.6 r_s$ the "short" volume coil has an improved SNR for a voxel located substantially on the central plane of the coil, relative to the SNR of a "normal"-length volume coil with $L_c$ greater or equal to $4 r_s$.

A journal article, "The NMR Phased Array" by P. B. Roemer et al. (Magn Reson Med. 1990 November; Vol. 16 Issue 262 pages 192-225), describes a phased array receive coil, and is incorporated herein by reference. Roemer et al. describe ways to overlap coil loops (circular loops overlapped by spacing the centers of the circular loops at 0.75 diameter, and square loops by about 0.9 diameter; and the loops are all the same size) to reduce mutual-induction interference.

U.S. Pat. No. 6,534,983 to Boskamp et al. issued Mar. 18, 2003 with the title "Multi-channel phased array coils having minimum mutual inductance for magnetic resonance systems" and is incorporated herein by reference. In U.S. Pat. No. 6,534,983, Boskamp et al. describe a multi-channel phased array coil for use in a magnetic resonance (MR) system is disclosed herein. The phased array coil includes N coils configured in an array, each of the N coils having a geometric shape and overlapping with (N−1) coils to form an overlap area within the array. The geometric shape of each of the coils and the overlap area are configured to cause a mutual inductance between every pair of the coils to be less than 10 percent of the self-inductance of each of the N coils. At least four coils are provided in the phased array coil.

U.S. Pat. No. 6,538,441 issued to Watkins et al. on Mar. 25, 2003 with the title "RF coil for reduced electric field exposure for use in very high field magnetic resonance imaging" and is incorporated herein by reference. In U.S. Pat. No. 6,538,441, Watkins et al. describe an RF coil assembly for a very high field Magnetic Resonance Imaging (MRI) system is provided. The RF coil assembly comprises a plurality of conductors arranged cylindrically and disposed about a patient bore tube of the MRI system. Each of the conductors is configured for the RF coil assembly to resonate at substantially high frequencies. Further, the RF coil assembly comprises a plurality of capacitive elements disposed between and connecting respective ends of the conductors and further disposed in a spaced-apart relationship with the patient bore tube. The capacitive elements are for electrically interconnecting the plurality of conductors at the respective ends of the conductors.

U.S. Pat. No. 6,822,448 issued to Watkins et al. on Nov. 23, 2004 with the title "RF coil for very high field magnetic resonance" and is incorporated herein by reference. In U.S. Pat. No. 6,822,448, Watkins et al. describe an RF coil assembly for a very high field Magnetic Resonance Imaging (MRI) system is provided comprising a plurality of conductors arranged cylindrically and disposed about a cylindrical patient bore tube of the MRI system and a plurality of capacitive elements for electrically interconnecting the plurality of conductors at respective ends of the conductors. The conductors have a width selected for the RF coil assembly to resonate at substantially high frequencies. A very high field Magnetic Resonance Imaging (MRI) system is provided that comprises a RF coil assembly adapted to resonate at substantially high frequencies, a RF coil shield assembly and a plurality of RF drive power cables.

There is a long-felt need for improved SNR from received signals in an MRI system.

SUMMARY OF THE INVENTION

The present invention provides strongly coupled overlapped and/or concentric radio-frequency (RF) MRI coils that are optionally located at different elevations (distances from the patient's tissue) in order to extract signal from cross-coupled coil loops and to improve signal-to-noise ratio (SNR) of the received signal. One or more of independent receive pre-amplifiers (preamps) are used to collect the received signal and the MR image reconstructed from the received signal. In some embodiments, a plurality of pre-amps is connected to each of a plurality of coil loops. In some embodiments, the received signals are decoded (e.g., using differential analog amplifiers on the analog signals, or are digitally processed) to remove common-mode signal, and to improve SNR.

In contrast to U.S. Pat. No. 6,534,983 to Boskamp et al. (where the geometric shape of each of the coil loops and the overlap area are configured to cause a mutual inductance between every pair of the coil loops to be less than ten percent (10%) of the self-inductance of each of the N coils), some embodiments of the present invention use concentric and/or overlapped coil loops, each coil loop having one or more individual preamplifiers. In some embodiments, the loops are made identical or nearly so in order to be able to more effectively remove the transmitted signal from the received signal. In some other embodiments, the plurality of loops of the present invention will be arranged to reduce mutual inductance, but the greater number of coil loops is used to advantage in order to achieve greater signal-to-noise ratio (SNR) in spite of the greater mutual inductance due to overlapping and/or concentric coil loops. The outputs of the plurality of preamplifiers are analyzed and decoded relative to one another to electronically and/or computationally remove signal due to the mutual inductance between various pairs of the coil loops.

In some embodiments, a set of coil loops have each of their outputs phase shifted by possibly different amounts, and have their respective amplitudes varied by possibly different amounts, and their signals added or subtracted from one another by decoder circuitry to improve the SNR.

BRIEF DESCRIPTION OF THE DRAWINGS

FIG. 1A is a plan-view block diagram of a coil-loop-pair system 101 having a pair of overlapping and/or concentric coil loops 130 connected to RF Tx-Rx electronics systems 190, according to some embodiments of the present invention.

FIG. 1B is a slightly-tilted edge-view block diagram of coil-loop-pair system 101, according to some embodiments of the present invention.

FIG. 1C is block diagram schematic of coil-loop-pair system 101, according to some embodiments of the present invention.

DESCRIPTION OF PREFERRED EMBODIMENTS

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The embodiments shown in the Figures and described here may include features that are not included in all specific embodiments. A particular embodiment may include only a subset of all of the features described, or a particular embodiment may include all of the features described.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

Figure 1D:
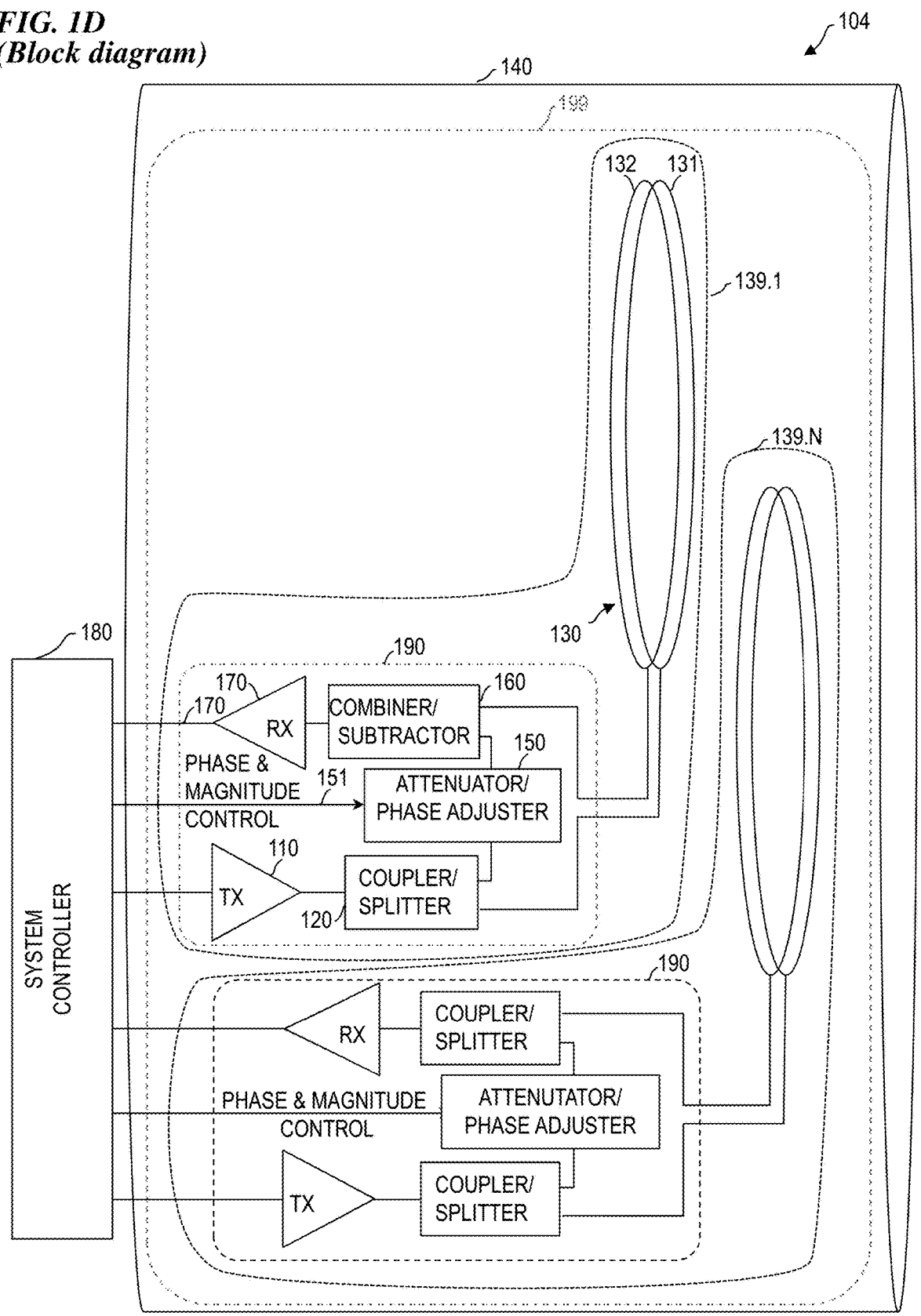
FIG. 1D is a slightly-tilted edge-view block diagram of a coil-loops system 104 having a plurality of concentric coil loop pair subsystems 139.1 through 139.N, each including its own RF Tx-Rx electronics system 190, according to some embodiments of the present invention.

FIG. 1A is a plan-view block diagram of a coil-loop-pair subsystem 101 having a pair 130 of overlapping and/or concentric coil loops 131 and 132 connected to RF Tx-Rx electronics system 190, according to some embodiments of the present invention. In some embodiments, coil-loop-pair system 101 includes RF Tx-Rx electronics system 190. In some embodiments, RF Tx-Rx electronics system 190 includes a transmit (TX) amplifier 110, signal splitter 120, electronically-adjustable attenuator-phase adjuster 150, combiner-subtractor 160 and receive (RX) preamplifier 170. In some embodiments, TX amplifier 110 is connected by coax (coaxial conductor) 111 to combiner-splitter 120 (here acting as an impedance-matched splitter), wherein a first portion of the transmit signal is coupled via coax 121 to a transmit loop 131, which transmits the RF pulse toward the tissue being examined (e.g., in some embodiments, toward a patient in an MRI machine). The transmitted pulse is also received by receive loop 132, and that signal is removed from the received signal as described below. The signal from the tissue being examined is also received by the receive loop 132. Circuit 150 provides a controllable amount of attenuation and phase adjustment. A second portion of the transmit signal is coupled from splitter 120 via coax 151 to attenuation/phase adjustment device 152 (shown here as a potentiometer, but in some embodiments, implemented as an electronically controlled impedance that provides adjustment to phase and amplitude of the signal provided to combiner-subtractor 160, and which is controlled by the MRI system controller electronics (e.g., subsystem 180 of FIG. 1E). The received signal from loop 132 is coupled via coax 161 to combiner-subtractor 160. The net received signal from combiner-subtractor 160 is coupled via coax 171 to RX preamplifier 170. The pre-amplified signal from RX preamplifier 170 is coupled out of the MRI magnet bore to the system console for analysis and image generation. In some embodiments, the geometry and orientation of loop 131 and loop 132 are controlled (e.g., in some embodiments, by making them concentric, closely spaced and equal-sized) such that the transmit signal that is directly received by loop 132 from loop 131 is substantially identical to the signal from circuit 150, such that when combined (i.e., 180-degrees out of phase) they cancel each other out, leaving a net received signal with a high signal-to-noise ratio (SNR). In some embodiments, all of the devices and electronics shown in FIG. 1A are located in the MRI magnet bore (e.g., in some embodiments, for example, in a coil housing 199 in a MRI magnet bore 140 of FIG. 1D or FIG. 1E).

FIG. 1B is a slightly-tilted edge-view block diagram of coil-loops system 101, according to some embodiments of the present invention. See the description of FIG. 1A. Details of RF Tx-Rx electronics system 190 are as shown in FIG. 1A.

FIG. 1C is a block diagram schematic of coil-loops system 101, according to some embodiments of the present invention. See the description of FIG. 1A.

FIG. 1D is a slightly-tilted edge-view block diagram of a coil-loops system 104 having a plurality of concentric-coil-loop-pair subsystems 139.1 through 139.N, each including its own RF Tx-Rx electronics system 190, according to some embodiments of the present invention. In some embodiments, each one of concentric-coil-loop-pair subsystems 139.1 through 139.N is implemented using a coil-loops system 101 such as described above. In some embodiments, each of the concentric-coil-loop-pair subsystems 139.1 through 139.N is laterally offset from its nearest neighbor, in order to provide a large area/volume of coverage. In some embodiments, each of the concentric-coil-loop-pair subsystems 139.1 through 139.N is driven by a different one of a plurality of transmit pulses that are offset in time. In some embodiments, each of a plurality of the transmit loops is driven by the same transmit pulse, but wherein a different amount of time or phase delay is provided to each respective copy of the single pulse sent to the different transmit loops, such that the net transmit signal is steered and shaped, as is known in the phased-array-antenna art. In other embodiments, the respective pulses used to drive the plurality of concentric-coil-loop-pair subsystems 139.1 through 139.N are separated in time such that the received signal from a given receive loop 132 is only from the effects of the transmit pulse sent by its paired transmit loop 131, and signals received from other pulses sent from other transmit loops are offset in time and are shunted and/or ignored. In this way, a succession of pulses is sent and received one at a time across an array of concentric-coil-loop-pair subsystems 139.1 through 139.N to obtain clean signals from the entire volume of tissue being examined. In some embodiments, the entire array of concentric-coil-loop-pair subsystems 139.1 through 139.N including their respective RF Tx-Rx electronics systems 190 are located in a coil housing 199 located in the bore 140 of the magnet of an MRI machine. In some embodiments, system controller 180 provides the transmit-pulse sequences to the transmit amplifiers 110 and the control signals to the electronically controlled attenuator/phase-adjustment circuits 150 in order to closely control the amplitude and time delay of the signals output from circuits 150 that are subtracted by combiner-subtractors 160.

Figure 1E:
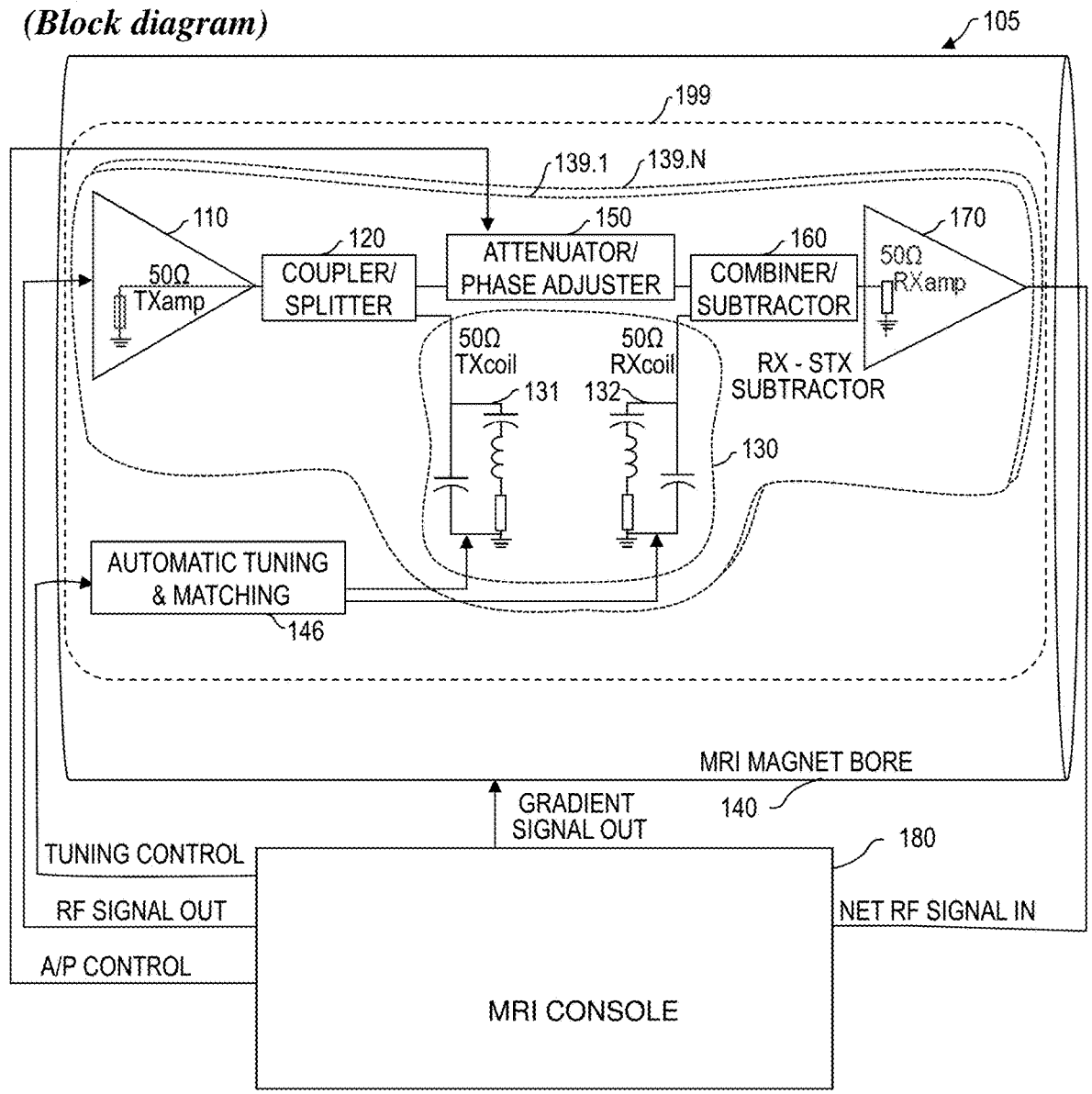
FIG. 1E is a schematic block diagram of a MRI system 105 having a plurality of concentric coil-loop-pair subsystems 139.1 through 139.N, each including its own RF Tx-Rx electronics system 190, all located in the bore 140 of an MRI magnet, according to some embodiments of the present invention.

FIG. 1E is a schematic block diagram of a MRI system 105 having a plurality of concentric coil loop pair subsystems 139.1 through 139.N, each including its own RF Tx-Rx electronics system 190, all located in the bore 140 of an MRI magnet, according to some embodiments of the present invention. In some embodiments, the system controller 180 is largely implemented in the MRI console electronics. In some embodiments, system controller 180 provides gradient-control signals to the gradient coils, tuning/matching control signals to the automatic tune-and-match circuits 146, RF signal-out transmit pulse sequences sent to the plurality of transmit amplifiers 110, and the attenuation/phase (A/P) control signals sent to the plurality of attenuator/phase-adjuster circuits 150. In some embodiments, the system controller 180 also receives the net received RF signal input (the net received signal after the transmit signal has been subtracted from the signal obtained from RX loop 132). In some embodiments, the plurality of coil-loop-pair subsystems 139.1 through 139.N include transmit amplifiers 110 mounted in the coil housing 199 that is in the bore 140, in order to reduce signal loss in the coax used for the TX signals. In other embodiments, the transmit amplifiers 110 are located remotely (e.g., in some embodiments, outside the magnet room), and are connected via coax to the coupler-splitters 120 located in the coil housing. In some embodiments, the automatic tune-and-match circuits 146 are located in the coil housing 199.

Figure 2:
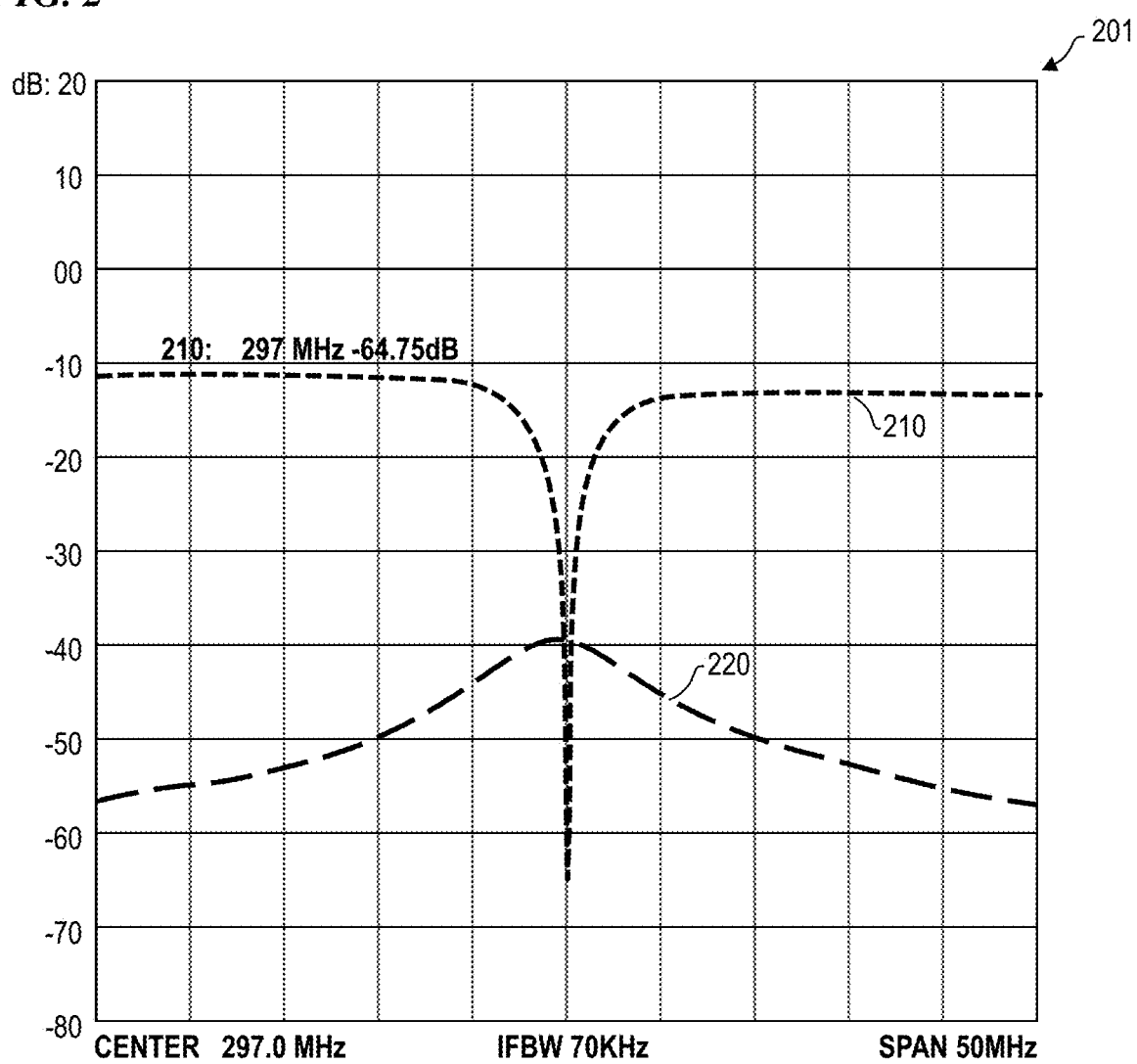
FIG. 2 is a graph 201 demonstrating the removal of the transmit signal from the received signal, according to some embodiments of the present invention.

FIG. 2 is a graph 201 demonstrating the removal of the transmit signal from the received signal, according to some embodiments of the present invention.

The Figures herein show embodiments using substantially circular coil loops that are used in some embodiments. In other embodiments, square coil loops, rectangular coil loops, pentagonal and/or hexagonal coil loops, or other geometric shapes are used. In some embodiments, combinations of different geometric shapes are used for the coil loops.

In some embodiments, the present invention provides an apparatus for processing radio-frequency (RF) signals suitable for magnetic-resonance imaging (MRI) and/or magnetic-resonance spectroscopy (MRS) from radio-frequency (RF) coils that are overlapped and/or concentric, but optionally sized differently and/or located at different elevations (distances from the patient's tissue) in order to extract signal from strongly-coupled coil loops and to improve signal-to-noise ratio (SNR) of the received signal. This apparatus includes a housing; a transmitter-receiver-electronics unit mounted on the housing, wherein the transmitter-receiver-electronics generates a transmit signal split into a first portion and a second portion; an RF loop pair mounted to the housing, wherein the RF loop pair includes a transmit antenna loop connected to receive the first portion of the transmit signal and a receive antenna loop configured to receive signals from the transmit loop and from, and combiner-subtractor electronics operatively coupled to obtain signals from the receive loop and to the second portion of the transmit signal and configured to subtract the second portion of the transmit signal from the signals from the receive loop.

Some embodiments further include an attenuator-phase-adjustment circuit coupled to adjust an amplitude and phase of the second portion of the transmit signal.

In some embodiments, each of the plurality of RF receiver units further includes: a frequency-tuning capacitor, an impedance-matching capacitor, an RF trap, and a preamplifier.

In some embodiments, each of the plurality of RF receiver units further includes: a least one frequency-tuning capacitor, a plurality of impedance-matching capacitors, a plurality of RF traps, and a plurality of preamplifiers.

In some embodiments, the present invention provides a non-transitory computer-readable medium having instructions stored thereon for causing a suitably programmed information processor to execute a method that includes adjusting an amplitude and a phase of a portion of a transmit signal in order to generate a signal useful for removing common-mode transmit signals from a received MRI signal. In some embodiments, the medium contains instructions such that the method further includes using a feedback signal operatively coupled to the programmable information-processing device to provide feedback control in order to maintain an electrical parameter of the plurality of receiver-electronics units. In some embodiments, the medium contains instructions such that the method further includes controlling resistance, inductance and capacitance (RLC) values of the plurality of receiver-electronics units.

In some embodiments, the present invention provides a non-transitory computer-readable medium having instructions stored thereon for causing a suitably programmed information processor to execute a method that includes: autocontrolling an electrical parameter of each of a plurality of receiver-electronics units that is mounted to a MRI receiver coil unit. In some embodiments, the medium contains instructions such that the method further includes using a feedback signal operatively coupled to the programmable information-processing device to provide feedback control in order to maintain the electrical parameter of the plurality of receiver-electronics units. In some embodiments, the medium contains instructions such that the method further includes controlling resistance, inductance and capacitance (RLC) values of the plurality of receiver-electronics units.

In some embodiments, the present invention provides a non-transitory computer-readable medium having instructions stored thereon for causing a suitably programmed information processor to execute a method that comprises: autocontrolling an electrical parameter of an LC circuit that is mounted to a case of a snap-on balun (electrical device that converts between a balanced signal (two signals working against each other where ground is irrelevant) and an unbalanced signal (a single signal working against ground or pseudo-ground)) attached to a shielded RF cable that has a peripheral shield conductor and at least one inner conductor for carrying RF signals, wherein the LC circuit has a resonance frequency at a frequency of RF signals carried on the at least one inner conductor, wherein the case includes a piercing structure electrically connected to the LC circuit and configured to pierce and electrically connect the LC circuit to the shield conductor of the shielded RF cable.

In some embodiments, the present invention provides an method and apparatus for processing radio-frequency (RF) signals suitable for magnetic-resonance imaging (MRI) and/or magnetic-resonance spectroscopy (MRS) from radio-frequency (RF) coils that have strongly-coupled coil loop pairs, each pair including a transmit loop and a receive loop, wherein the transmit loop and the receive loop are of equal sizes and shapes and in close proximity to each other, and wherein a suitable attenuated and phase-adjusted version of a transmit pulse is subtracted from a receive signal obtained from tissue being examined to improve signal-to-noise ratio (SNR) of the received signal.

In some embodiments, the present invention provides an apparatus for processing radio-frequency (RF) signals suitable for magnetic-resonance imaging (MRI) and/or magnetic-resonance spectroscopy (MRS) from radio-frequency (RF) coils that have strongly-coupled coil loops to improve signal-to-noise ratio (SNR) of the received signal obtained from tissue being examined. This apparatus includes a housing; radio-frequency (RF) transmitter-receiver electronics mounted to the housing, wherein the RF transmitter-receiver-electronics includes a first RF transmitter unit and a first RF receiver unit, wherein the first RF transmitter unit generates a first transmit signal that is split into a first portion of the first transmit signal and a second portion of the first transmit signal; a first RF loop pair mounted to the housing, wherein the first RF loop pair includes a transmit antenna loop operably connected to transmit the first portion of the first transmit signal and a receive antenna loop configured to receive signals from the transmit antenna loop of the first RF loop pair and from the tissue being examined; and combiner-subtractor electronics operatively coupled to obtain signals from the receive loop of the first RF loop pair and to obtain the second portion of the first transmit signal and configured to subtract the second portion of the first transmit signal from the signals from the receive loop of the first RF loop pair to form a first net received signal.

In some embodiments of this apparatus, the first RF receiver unit further includes a frequency-tuning capacitor, an impedance-matching capacitor, an RF trap, and a preamplifier.

In some embodiments of this apparatus, the combiner-subtractor electronics further includes an attenuator-phase-adjustment circuit coupled to adjust an amplitude and phase of the second portion of the first transmit signal.

In some embodiments of this apparatus, the combiner-subtractor electronics further includes an attenuator-phase-adjustment circuit that includes a length of coax cable and an electronically controlled impedance that provides adjustment to phase and amplitude of the second portion of the first transmit signal.

Some embodiments of this apparatus further include a plurality of RF loop pairs mounted to the housing including a second RF loop pair, wherein the second RF loop pair includes a transmit antenna loop and a receive antenna loop, the RF transmitter-receiver-electronics includes a plurality of RF transmitter units and a plurality of RF receiver units, wherein each of the plurality of RF transmitter units generates a respective one of a plurality of transmit signals, wherein the plurality of RF transmitter units includes a second RF transmitter unit, wherein the plurality of RF receiver units includes a second RF receiver unit, wherein the second RF transmitter unit generates a second transmit signal of the plurality of transmit signals that is split into a first portion of the second transmit signal and a second portion of the second transmit signal, the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined, and the combiner-subtractor electronics is operatively coupled to obtain signals from the receive loop of the second RF loop pair and to obtain the second portion of the second transmit signal and is configured to subtract the second portion of the second transmit signal from the signals from the receive loop of the second RF loop pair to form a second net received signal.

Some embodiments of this apparatus further include a plurality of RF loop pairs mounted to the housing, wherein the plurality of RF loop pairs includes a second RF loop pair, wherein the second RF loop pair includes a transmit antenna loop and a receive antenna loop, wherein the RF transmitter-receiver-electronics includes a plurality of RF transmitter units and a plurality of RF receiver units, wherein each of the plurality of RF transmitter units generates a respective one of a plurality of transmit signals, wherein the plurality of transmit signals includes a second RF transmitter unit, wherein the plurality of RF receiver units includes a second RF receiver unit, and wherein the second RF transmitter unit generates a second transmit signal of the plurality of transmit signals that is split into a first portion of the second transmit signal and a second portion of the second transmit signal, wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined, wherein the combiner-subtractor electronics is operatively coupled to obtain signals from the receive loop of the second RF loop pair and to obtain the second portion of the second transmit signal and is configured to subtract the second portion of the second transmit signal from the signals from the receive loop of the second RF loop pair to form a second net received signal, and wherein each of the plurality of RF receiver units further includes a least one frequency-tuning capacitor, a plurality of impedance-matching capacitors, a plurality of RF traps, and a plurality of preamplifiers.

Some embodiments of this apparatus further include a plurality of RF loop pairs mounted to the housing including a second RF loop pair, wherein the second RF loop pair includes a transmit antenna loop and a receive antenna loop, wherein the RF transmitter-receiver-electronics includes a plurality of RF transmitter units each of which generates a respective one of a plurality of transmit signals including a second RF transmitter unit, and a plurality of RF receiver units including a second RF receiver unit, wherein the second RF transmitter unit generates a second transmit signal of the plurality of transmit signals that is split into a first portion of the second transmit signal and a second portion of the second transmit signal, wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined, wherein the combiner-subtractor electronics is operatively coupled to obtain signals from the receive loop of the second RF loop pair and to obtain the second portion of the second transmit signal and is configured to subtract the second portion of the second transmit signal from the signals from the receive loop of the second RF loop pair to form a second net received signal, and wherein the apparatus further includes a plurality of attenuator-phase-adjustment circuits each coupled to adjust an amplitude and a phase of the second portion of a respective one of the plurality of transmit signals.

Some embodiments of this apparatus further include a plurality of RF loop pairs mounted to the housing including a second RF loop pair, wherein the second RF loop pair includes a transmit antenna loop and a receive antenna loop, wherein the RF transmitter-receiver-electronics includes a plurality of RF transmitter units each of which generates a respective one of a plurality of transmit signals including a second RF transmitter unit, and a plurality of RF receiver units including a second RF receiver unit, wherein the second RF transmitter unit generates a second transmit signal of the plurality of transmit signals that is split into a first portion of the second transmit signal and a second portion of the second transmit signal, wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined, and wherein the combiner-subtractor electronics is operatively coupled to obtain signals from the receive loop of the second RF loop pair and to obtain the second portion of the second transmit signal and is configured to subtract the second portion of the second transmit signal from the signals from the receive loop of the second RF loop pair to form a second net received signal, and wherein the apparatus further includes: a plurality of attenuator-phase-adjustment circuits each coupled to adjust an amplitude and a phase of the second portion of a respective one of the plurality of transmit signals; a plurality of automatic tune-and-match circuits operatively coupled to the RF transmitter-receiver-electronics; an MRI magnet having an MRI magnet bore, wherein the housing, the plurality of RF loop pairs, at least a portion of the RF transmitter-receiver electronics, and at least a portion of the combiner-subtractor electronics are located in the magnet bore; gradient coils located in the MRI magnet bore; and MRI console electronics including a system controller, wherein the system controller provides gradient-control signals to the gradient coils, tuning/matching control signals to the plurality of automatic tune-and-match circuits, RF signal-out transmit pulse sequences sent to the plurality of RF transmitter units, and attenuation/phase (A/P) control signals sent to the plurality of attenuator-phase-adjustment circuits, and wherein, the system controller also receives a plurality of net received RF signals and generates an MR image therefrom.

In some embodiments, the present invention provides a method for processing radio-frequency (RF) signals suitable for magnetic-resonance imaging (MRI) and/or magnetic-resonance spectroscopy (MRS) from radio-frequency (RF) coils that have strongly-coupled coil loops to improve signal-to-noise ratio (SNR) of the received signal obtained from tissue being examined. This method includes providing a housing, radio-frequency (RF) transmitter-receiver electronics mounted to the housing, and a first RF loop pair mounted to the housing, wherein the first RF loop pair includes a transmit antenna loop and a receive antenna loop; splitting a first transmit signal pulse from the RF transmitter-receiver electronics into a first portion and a second portion; adjusting an amplitude and a phase of the second portion of the first transmit signal pulse to obtain a first amplitude-and-phase-adjusted signal pulse; transmitting the first portion of the first transmit signal pulse using the transmit antenna loop of the first RF loop pair; receiving a first resulting signal using the receive antenna loop of the first RF loop pair, the first resulting signal including signals from the transmit loop of the first RF loop pair and from the tissue being examined; subtracting the first amplitude-and-phase-adjusted signal pulse from the received first resulting signal to obtain a first net received signal; and generating an MRI output image based at least in part on the first net received signal.

In some embodiments of the method, the adjusting of the amplitude and the phase of the second portion of the first transmit signal pulse includes passing the second portion of the first transmit signal pulse through a length of coax cable and electronically adjusting an impedance of circuitry that operates on the second portion of the first transmit signal pulse.

Some embodiments of the method further include electronically frequency matching a characteristic frequency of the transmit antenna loop of first RF loop pair to a transmit frequency of the first transmit signal pulse; and electronically impedance matching a characteristic impedance of the transmit antenna loop of first RF loop pair to an impedance of the RF transmitter-receiver electronics.

Some embodiments of the method further include electronically frequency matching a characteristic frequency of the receive antenna loop of first RF loop pair to a transmit frequency of the first transmit signal pulse; and electronically impedance matching a characteristic impedance of the receive antenna loop of first RF loop pair to an impedance of the RF transmitter-receiver electronics.

In some embodiments of the method, the providing includes providing a plurality of RF loop pairs mounted to the housing including a second RF loop pair, wherein the second RF loop pair includes a transmit antenna loop and a receive antenna loop, wherein the providing of the RF transmitter-receiver-electronics includes providing a plurality of RF transmitter units and a plurality of RF receiver units, wherein each of the plurality of RF transmitter units generates a respective one of a plurality of transmit signal pulses, wherein the plurality of RF transmitter units includes a second RF transmitter unit, wherein the plurality of RF receiver units includes a second RF receiver unit, and wherein the second RF transmitter unit generates a second transmit signal of the plurality of transmit signals that is split into a first portion of the second transmit signal and a second portion of the second transmit signal, and wherein the method further includes: splitting the second transmit signal into a first portion and a second portion; adjusting an amplitude and a phase of the second portion of the second transmit signal to obtain a second amplitude-and-phase-adjusted signal; transmitting the first portion of the second transmit signal using the transmit antenna loop of the second RF loop pair; receiving a second resulting signal using the receive antenna loop of the second RF loop pair, wherein the second resulting signal included signals from the transmit loop of the first RF loop pair and from the tissue being examined; subtracting the second amplitude-and-phase-adjusted signal from the received second resulting signal to obtain a second net received signal; and generating the MRI output image based at least in part on the second net received signal.

Some embodiments of the method further include electronically frequency matching a characteristic frequency of the transmit antenna loop of second RF loop pair to a transmit frequency of the first transmit signal pulse; electronically impedance matching a characteristic impedance of the transmit antenna loop of second RF loop pair to an impedance of the RF transmitter-receiver electronics; electronically frequency matching a characteristic frequency of the receive antenna loop of second RF loop pair to a transmit frequency of the first transmit signal pulse; and electronically impedance matching a characteristic impedance of the receive antenna loop of second RF loop pair to an impedance of the RF transmitter-receiver electronics.

Some embodiments of the method further include providing an MRI magnet having an MRI magnet bore, wherein the housing, the plurality of RF loop pairs, at least a portion of the RF transmitter-receiver electronics, and at least a portion of the combiner-subtractor electronics are located in the magnet bore; providing gradient coils located in the MRI magnet bore; and providing MRI console electronics including a system controller, wherein the system controller provides gradient-control signals to the gradient coils, tuning/matching control signals to the plurality of automatic tune-and-match circuits, RF signal-out transmit pulse sequences sent to the plurality of RF transmitter units, and attenuation/phase (A/P) control signals sent to the plurality of attenuator-phase-adjustment circuits, and wherein, the system controller also receives a plurality of net received RF signals and generates an MR image therefrom.

In some embodiments, the present invention provides a non-transitory computer-readable medium having instructions stored thereon for causing a suitably programmed information processor to execute a method for processing radio-frequency (RF) signals suitable for magnetic-resonance imaging (MRI) and/or magnetic-resonance spectroscopy (MRS) from radio-frequency (RF) coils that have strongly-coupled coil loops to improve signal-to-noise ratio (SNR) of the received signal obtained from tissue being examined, in a system that includes a housing, a transmitter-receiver-electronics unit mounted on the housing, and plurality of RF loop pairs mounted to the housing, wherein the plurality of RF loop pairs includes a first RF loop pair, wherein the first RF loop pair includes a transmit antenna loop and a receive antenna loop that are strongly coupled to one another, and wherein a first transmit signal pulse is split into a first portion and a second portion; wherein the method includes: adjusting an amplitude and a phase of the second portion of the first transmit signal pulse to obtain a first amplitude-and-phase-adjusted signal pulse; transmitting the first portion of the transmit signal pulse using the transmit antenna loop of the first RF loop pair; receiving a first resulting signal using the receive antenna loop of the first RF loop pair, wherein the first resulting signal includes signals from the transmit loop and from the tissue being examined; subtracting the first amplitude-and-phase-adjusted signal from the first received resulting signal to obtain a first net received signal; and generating an MRI output image based at least in part on the first net received signal.

In some embodiments of the non-transitory computer-readable medium, the medium further includes instructions such that the adjusting of the amplitude and the phase of the second portion of the first transmit signal pulse includes passing the second portion of the first transmit signal pulse through a length of coax cable and electronically adjusting an impedance of circuitry that operates on the second portion of the first transmit signal pulse.

In some embodiments of the non-transitory computer-readable medium, the medium further includes instructions such that the method further includes: electronically frequency matching a characteristic frequency of the transmit antenna loop of first RF loop pair to a transmit frequency of the first transmit signal pulse; and electronically impedance matching a characteristic impedance of the transmit antenna loop of first RF loop pair to an impedance of the RF transmitter-receiver electronics.

In some embodiments of the non-transitory computer-readable medium, the medium further includes instructions such that the method further includes: electronically frequency matching a characteristic frequency of the receive antenna loop of first RF loop pair to a transmit frequency of the first transmit signal pulse; and electronically impedance matching a characteristic impedance of the receive antenna loop of first RF loop pair to an impedance of the RF transmitter-receiver electronics.

In some embodiments, the subsystems and elements of the invention described above are combined with portions or all of the patents and patent applications set forth above, each of which is incorporated herein by reference, in order to obtain various embodiments of the present invention.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and patent-application publications incorporated by reference in the present application). Further, some embodiments include fewer than all the components described as part of any one of the embodiments described herein.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method for processing radio-frequency (RF) signals suitable for magnetic-resonance imaging (MRI) and/or magnetic-resonance spectroscopy (MRS) from radio-frequency (RF) coils that have strongly-coupled coil loops to improve signal-to-noise ratio (SNR) of the received signal obtained from tissue being examined, the method comprising:
    providing a housing, radio-frequency (RF) transmitter-receiver electronics mounted to the housing, and a first RF loop pair mounted to the housing, wherein the first RF loop pair includes a transmit antenna loop and a receive antenna loop that is strongly coupled to, and substantially of equal shape and size as, the transmit antenna loop;
    splitting a first transmit signal pulse from the RF transmitter-receiver electronics into a first portion and a second portion;
    adjusting an amplitude and a phase of the second portion of the first transmit signal pulse to obtain a first amplitude-and-phase-adjusted signal pulse;
    transmitting the first portion of the first transmit signal pulse using the transmit antenna loop of the first RF loop pair;
    receiving a first resulting signal using the receive antenna loop of the first RF loop pair, the first resulting signal including signals from the transmit loop of the first RF loop pair and from the tissue being examined;
    combining the first amplitude-and-phase-adjusted signal pulse and the received first resulting signal in a combiner to obtain a first net received signal; and
    generating an MRI output image based at least in part on the first net received signal.

2. The method of claim 1, wherein the adjusting of the amplitude and the phase of the second portion of the first transmit signal pulse includes passing the second portion of the first transmit signal pulse through a length of coax cable and electronically adjusting an impedance of circuitry that operates on the second portion of the first transmit signal pulse.

3. The method of claim 1, further comprising:
    electronically frequency matching a characteristic frequency of the transmit antenna loop of first RF loop pair to a transmit frequency of the first transmit signal pulse; and
    electronically impedance matching a characteristic impedance of the transmit antenna loop of first RF loop pair to an impedance of the RF transmitter-receiver electronics.

4. The method of claim 1, further comprising:
    electronically frequency matching a characteristic frequency of the receive antenna loop of first RF loop pair to a transmit frequency of the first transmit signal pulse; and
    electronically impedance matching a characteristic impedance of the receive antenna loop of first RF loop pair to an impedance of the RF transmitter-receiver electronics.

5. The method of claim 1,
    wherein the providing includes providing a plurality of RF loop pairs mounted to the housing including a second RF loop pair, wherein the second RF loop pair includes a transmit antenna loop and a receive antenna loop,
    wherein the providing of the RF transmitter-receiver-electronics includes providing a plurality of RF transmitter units and a plurality of RF receiver units, wherein each of the plurality of RF transmitter units generates a respective one of a plurality of transmit signal pulses, wherein the plurality of RF transmitter units includes a second RF transmitter unit, wherein the plurality of RF receiver units includes a second RF receiver unit, and wherein the second RF transmitter unit generates a second transmit signal of the plurality of transmit signals that is split into a first portion of the second transmit signal and a second portion of the second transmit signal, and
    wherein the method further comprises:
    splitting the second transmit signal into a first portion and a second portion;
    adjusting an amplitude and a phase of the second portion of the second transmit signal to obtain a second amplitude-and-phase-adjusted signal;
    transmitting the first portion of the second transmit signal using the transmit antenna loop of the second RF loop pair;
    receiving a second resulting signal using the receive antenna loop of the second RF loop pair, wherein the second resulting signal included signals from the transmit loop of the first RF loop pair and from the tissue being examined;
    combining the second amplitude-and-phase-adjusted signal and the received second resulting signal to obtain a second net received signal; and
    generating the MRI output image based at least in part on the second net received signal.

6. The method of claim 5, further comprising
    electronically frequency matching a characteristic frequency of the transmit antenna loop of second RF loop pair to a transmit frequency of the first transmit signal pulse;
    electronically impedance matching a characteristic impedance of the transmit antenna loop of second RF loop pair to an impedance of the RF transmitter-receiver electronics;
    electronically frequency matching a characteristic frequency of the receive antenna loop of second RF loop pair to a transmit frequency of the first transmit signal pulse; and
    electronically impedance matching a characteristic impedance of the receive antenna loop of second RF loop pair to an impedance of the RF transmitter-receiver electronics.

7. The method of claim 1, wherein the providing further includes:

providing an MRI magnet having an MRI magnet bore, wherein the housing, the first RF loop pair, at least a portion of the RF transmitter-receiver electronics, and at least a portion of the combiner are located in the magnet bore;

providing gradient coils located in the MRI magnet bore; and providing MRI console electronics including a system controller, wherein the system controller provides gradient-control signals to the gradient coils, tuning/matching control signals to a plurality of automatic tune-and-match circuits, RF signal-out transmit pulse sequences sent to a plurality of RF transmitter units, and attenuation/phase (A/P) control signals sent to a plurality of attenuator-phase-adjustment circuits, and wherein, the system controller also receives a plurality of net received RF signals and generates an MR image therefrom.

8. A non-transitory computer-readable medium having instructions stored thereon for causing a suitably programmed information processor to execute a method for processing radio-frequency (RF) signals suitable for magnetic-resonance imaging (MRI) and/or magnetic-resonance spectroscopy (MRS) from radio-frequency (RF) coils that have strongly-coupled coil loops to improve signal-to-noise ratio (SNR) of the received signal obtained from tissue being examined, in a system that includes a housing, a transmitter-receiver-electronics unit mounted on the housing, and plurality of RF loop pairs mounted to the housing, wherein the plurality of RF loop pairs includes a first RF loop pair, wherein the first RF loop pair includes a transmit antenna loop, and a receive antenna loop that is strongly coupled to, and substantially of equal shape and size as, the transmit antenna loop, and wherein a first transmit signal pulse is split into a first portion and a second portion; wherein the method comprises:

adjusting an amplitude and a phase of the second portion of the first transmit signal pulse to obtain a first amplitude-and-phase-adjusted signal pulse;

transmitting the first portion of the transmit signal pulse using the transmit antenna loop of the first RF loop pair;

receiving a first resulting signal using the receive antenna loop of the first RF loop pair, wherein the receive antenna loop is strongly coupled to the transmit antenna loop, and wherein the first resulting signal includes signals from the transmit loop and from the tissue being examined;

combining the first amplitude-and-phase-adjusted signal and the first received resulting signal to obtain a first net received signal; and generating an MRI output image based at least in part on the first net received signal.

9. The non-transitory computer-readable medium of claim 8, wherein the medium further comprises instructions such that the adjusting of the amplitude and the phase of the second portion of the first transmit signal pulse includes passing the second portion of the first transmit signal pulse through a length of coax cable and electronically adjusting an impedance of circuitry that operates on the second portion of the first transmit signal pulse.

10. The non-transitory computer-readable medium of claim 8, wherein the medium further comprises instructions such that the method further comprises:

electronically frequency matching a characteristic frequency of the transmit antenna loop of first RF loop pair to a transmit frequency of the first transmit signal pulse; and electronically impedance matching a characteristic impedance of the transmit antenna loop of first RF loop pair to an impedance of the RF transmitter-receiver electronics.

11. The non-transitory computer-readable medium of claim 8, wherein the medium further comprises instructions such that the method further comprises:

electronically frequency matching a characteristic frequency of the receive antenna loop of first RF loop pair to a transmit frequency of the first transmit signal pulse; and electronically impedance matching a characteristic impedance of the receive antenna loop of first RF loop pair to an impedance of the RF transmitter-receiver electronics.

12. The non-transitory computer-readable medium of claim 8, wherein the medium further comprises instructions such that the method further comprises:

electronically frequency matching a characteristic frequency of the transmit antenna loop of first RF loop pair to a transmit frequency of the first transmit signal pulse;

electronically impedance matching a characteristic impedance of the transmit antenna loop of first RF loop pair to an impedance of the RF transmitter-receiver electronics;

electronically frequency matching a characteristic frequency of the receive antenna loop of first RF loop pair to a transmit frequency of the first transmit signal pulse; and electronically impedance matching a characteristic impedance of the receive antenna loop of first RF loop pair to an impedance of the RF transmitter-receiver electronics.

13. An apparatus for processing radio-frequency (RF) signals suitable for magnetic-resonance imaging (MRI) and/or magnetic-resonance spectroscopy (MRS) from radio-frequency (RF) coils that have strongly-coupled coil loops to improve signal-to-noise ratio (SNR) of the received signal obtained from tissue being examined, the apparatus comprising:

a housing;

radio-frequency (RF) transmitter-receiver electronics mounted to the housing, wherein the RF transmitter-receiver-electronics includes a first RF transmitter unit and a first RF receiver unit, wherein the first RF transmitter unit generates a first transmit signal that is split into a first portion of the first transmit signal and a second portion of the first transmit signal;

a first RF loop pair mounted to the housing, wherein the first RF loop pair includes a transmit antenna loop operably connected to transmit the first portion of the first transmit signal and a receive antenna loop that is strongly coupled to, and substantially of equal shape and size as, the transmit antenna loop and configured to receive signals from the transmit antenna loop of the first RF loop pair and from the tissue being examined; and combiner electronics operatively coupled to obtain signals from the receive loop of the first RF loop pair and to obtain the second portion of the first transmit signal and configured to combine the second portion of the first transmit signal and the signals from the receive loop of the first RF loop pair to form a first net received signal.

14. The apparatus of claim 13, wherein the first RF receiver unit further includes:

a frequency-tuning capacitor, an impedance-matching capacitor, an RF trap, and a preamplifier.

15. The apparatus of claim 13, wherein the combiner electronics further includes:
an attenuator-phase-adjustment circuit coupled to adjust an amplitude and phase of the second portion of the first transmit signal.

16. The apparatus of claim 13, wherein the combiner electronics further includes:
an attenuator-phase-adjustment circuit that includes a length of coax cable and an electronically controlled impedance that provides adjustment to phase and amplitude of the second portion of the first transmit signal.

17. The apparatus of claim 13,
wherein the apparatus includes a plurality of RF loop pairs mounted to the housing including a second RF loop pair, wherein the second RF loop pair includes a transmit antenna loop and a receive antenna loop,
wherein the RF transmitter-receiver-electronics includes a plurality of RF transmitter units and a plurality of RF receiver units, wherein each of the plurality of RF transmitter units generates a respective one of a plurality of transmit signals, wherein the plurality of RF transmitter units includes a second RF transmitter unit, wherein the plurality of RF receiver units includes a second RF receiver unit, wherein the second RF transmitter unit generates a second transmit signal of the plurality of transmit signals that is split into a first portion of the second transmit signal and a second portion of the second transmit signal,
wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined, and
wherein the combiner electronics is operatively coupled to obtain signals from the receive loop of the second RF loop pair and to obtain the second portion of the second transmit signal and is configured to combine the second portion of the second transmit signal and the signals from the receive loop of the second RF loop pair to form a second net received signal.

18. The apparatus of claim 13,
wherein the apparatus includes a plurality of RF loop pairs mounted to the housing, wherein the plurality of RF loop pairs includes a second RF loop pair, wherein the second RF loop pair includes a transmit antenna loop and a receive antenna loop,
wherein the RF transmitter-receiver-electronics includes a plurality of RF transmitter units and a plurality of RF receiver units, wherein each of the plurality of RF transmitter units generates a respective one of a plurality of transmit signals, wherein the plurality of transmit signals includes a second RF transmitter unit, wherein the plurality of RF receiver units includes a second RF receiver unit, and wherein the second RF transmitter unit generates a second transmit signal of the plurality of transmit signals that is split into a first portion of the second transmit signal and a second portion of the second transmit signal,
wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined,
wherein the combiner electronics is operatively coupled to obtain signals from the receive loop of the second RF loop pair and to obtain the second portion of the second transmit signal and is configured to combine the second portion of the second transmit signal and the signals from the receive loop of the second RF loop pair to form a second net received signal, and
wherein each of the plurality of RF receiver units further includes a least one frequency-tuning capacitor, a plurality of impedance-matching capacitors, a plurality of RF traps, and a plurality of preamplifiers.

19. The apparatus of claim 13,
wherein the apparatus includes a plurality of RF loop pairs mounted to the housing including a second RF loop pair, wherein the second RF loop pair includes a transmit antenna loop and a receive antenna loop,
wherein the RF transmitter-receiver-electronics includes a plurality of RF transmitter units each of which generates a respective one of a plurality of transmit signals including a second RF transmitter unit, and a plurality of RF receiver units including a second RF receiver unit, wherein the second RF transmitter unit generates a second transmit signal of the plurality of transmit signals that is split into a first portion of the second transmit signal and a second portion of the second transmit signal,
wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined,
wherein the combiner electronics is operatively coupled to obtain signals from the receive loop of the second RF loop pair and to obtain the second portion of the second transmit signal and is configured to combine the second portion of the second transmit signal and the signals from the receive loop of the second RF loop pair to form a second net received signal, and
wherein the apparatus further includes a plurality of attenuator-phase-adjustment circuits each coupled to adjust an amplitude and a phase of the second portion of a respective one of the plurality of transmit signals.

20. The apparatus of claim 13,
wherein the apparatus includes a plurality of RF loop pairs mounted to the housing including a second RF loop pair, wherein the second RF loop pair includes a transmit antenna loop and a receive antenna loop,
wherein the RF transmitter-receiver-electronics includes a plurality of RF transmitter units each of which generates a respective one of a plurality of transmit signals including a second RF transmitter unit, and a plurality of RF receiver units including a second RF receiver unit, wherein the second RF transmitter unit generates a second transmit signal of the plurality of transmit signals that is split into a first portion of the second transmit signal and a second portion of the second transmit signal,
wherein the transmit antenna loop of the second RF loop pair is operably connected to transmit the first portion of the second transmit signal and the receive antenna loop of the second RF loop pair is configured to receive signals from the transmit antenna loop of the first RF loop pair and from the tissue being examined, and wherein the combiner electronics is operatively coupled to obtain signals from the receive loop of the second RF loop pair and to obtain the second portion of the second transmit signal and is configured to combine the second portion of the second transmit signal and the signals from the receive loop of the second RF loop pair to form a second net received signal, and wherein the apparatus further comprises:

a plurality of attenuator-phase-adjustment circuits each coupled to adjust an amplitude and a phase of the second portion of a respective one of the plurality of transmit signals;

a plurality of automatic tune-and-match circuits operatively coupled to the RF transmitter-receiver-electronics;

an MRI magnet having an MRI magnet bore, wherein the housing, the plurality of RF loop pairs, at least a portion of the RF transmitter-receiver electronics, and at least a portion of the combiner electronics are located in the magnet bore;

gradient coils located in the MRI magnet bore; and

MRI console electronics including a system controller, wherein the system controller provides gradient-control signals to the gradient coils, tuning/matching control signals to the plurality of automatic tune-and-match circuits, RF signal-out transmit pulse sequences sent to the plurality of RF transmitter units, and attenuation/phase (A/P) control signals sent to the plurality of attenuator-phase-adjustment circuits, and wherein, the system controller also receives a plurality of net received RF signals and generates an MR image therefrom.

\* \* \* \* \*